United States Patent
Lin

(10) Patent No.: US 10,998,212 B2
(45) Date of Patent: May 4, 2021

(54) LOAD PORT ASSEMBLY WITH GAS CURTAIN DEVICE, AND PURGING METHOD FOR SUBSTRATE STORAGE POD

(71) Applicant: Springfield Technologies & Intelligence, Inc., Taipei (TW)

(72) Inventor: Kuan-Ting Lin, Taipei (TW)

(*) Notice: Subject to any disclaimer, the term of this patent is extended or adjusted under 35 U.S.C. 154(b) by 128 days.

(21) Appl. No.: 16/458,741

(22) Filed: Jul. 1, 2019

(65) Prior Publication Data
US 2020/0234988 A1 Jul. 23, 2020

(30) Foreign Application Priority Data
Jan. 19, 2019 (TW) .................................. 108102137

(51) Int. Cl.
*H01L 21/673* (2006.01)
*H01L 21/677* (2006.01)

(52) U.S. Cl.
CPC .. *H01L 21/67393* (2013.01); *H01L 21/67373* (2013.01); *H01L 21/67769* (2013.01); *H01L 21/67772* (2013.01); *H01L 21/67778* (2013.01)

(58) Field of Classification Search
CPC ......... H01L 21/67393; H01L 21/67772; H01L 21/67373; H01L 21/67778; H01L 21/67769; H01L 21/67017; H01L 21/67389; H01L 21/67775
USPC ............................................................ 141/1
See application file for complete search history.

(56) References Cited

U.S. PATENT DOCUMENTS

| | | | | |
|---|---|---|---|---|
| 4,303,056 A | * | 12/1981 | Slavik | F24B 1/1902 126/502 |
| 5,765,635 A | * | 6/1998 | Rhee | B60H 1/00742 165/203 |
| 7,014,672 B2 | * | 3/2006 | Ishihara | B01D 50/00 454/184 |
| 7,416,998 B2 | * | 8/2008 | Kisakibaru | H01L 21/67772 141/4 |
| 7,789,609 B2 | * | 9/2010 | Okabe | H01L 21/67772 414/217 |
| 9,305,817 B2 | | 4/2016 | Kaise et al. | |
| 10,276,415 B2 | * | 4/2019 | Kudo | H01L 21/67772 |
| 10,605,829 B2 | * | 3/2020 | Sakai | G01R 31/2867 |
| 2003/0172670 A1 | * | 9/2003 | Vormedal | F25D 23/023 62/407 |
| 2006/0199495 A1 | * | 9/2006 | Yamaguchi | A47F 3/0491 454/173 |
| 2006/0207971 A1 | * | 9/2006 | Moriya | H01L 21/67109 216/67 |
| 2007/0151619 A1 | * | 7/2007 | Okabe | H01L 21/67772 141/63 |

(Continued)

*Primary Examiner* — Timothy L Maust
*Assistant Examiner* — James R Hakomaki
(74) *Attorney, Agent, or Firm* — Robert M. Siminski

(57) ABSTRACT

A load port assembly includes a stage for supporting a substrate storage pod, a port plate with an access port, and a gas curtain device mounted on the port plate for forming a gas curtain having a width sufficient for shielding the access port. The gas curtain device includes an elongated casing and a gate mechanism. A curtain-forming gas is discharged from an elongated port of the elongated casing to form the gas curtain. A gate mechanism is mounted to the elongated casing and is configured to be actutable so as to vary a thickness of the gas curtain. A purging method for the substrate storage pod on the load port assembly is also disclosed.

20 Claims, 12 Drawing Sheets

(56) References Cited

U.S. PATENT DOCUMENTS

| | | | | |
|---|---|---|---|---|
| 2008/0135182 | A1* | 6/2008 | Nishikawa | B08B 5/02 |
| | | | | 156/536 |
| 2013/0000757 | A1* | 1/2013 | Yoshimura | H01L 21/67772 |
| | | | | 137/561 R |
| 2013/0042945 | A1* | 2/2013 | Emoto | H01L 21/67017 |
| | | | | 141/98 |
| 2014/0363258 | A1* | 12/2014 | Iwamoto | H01L 21/67772 |
| | | | | 414/217 |
| 2015/0024671 | A1* | 1/2015 | Taniyama | H01L 21/67017 |
| | | | | 454/193 |
| 2015/0214078 | A1* | 7/2015 | Iwamoto | H01L 21/67017 |
| | | | | 414/304 |
| 2016/0229277 | A1* | 8/2016 | Le Bastard | B61D 19/02 |
| 2016/0260628 | A1* | 9/2016 | Ochiai | H01L 21/67369 |
| 2017/0178942 | A1* | 6/2017 | Sakata | H01L 21/68707 |

* cited by examiner

LOAD PORT ASSEMBLY WITH GAS CURTAIN DEVICE, AND PURGING METHOD FOR SUBSTRATE STORAGE POD

CROSS-REFERENCE TO RELATED APPLICATION

This application claims priority from Taiwanese invention patent application no. 108102137, filed on Jan. 19, 2019.

FIELD

The disclosure relates to a load port assembly, more particularly to a load port assembly for a semiconductor manufacturing process. The disclosure also relates to a gas curtain device for the load port assembly, and a purging method for a substrate storage pod on the load port assembly.

BACKGROUND

A conventional load port module is located at one side of a semiconductor manufacturing device, and is configured to support a front opening unified pod (FOUP) thereon so as to permit the semiconductor manufacturing device to access wafers inside the FOUP.

A gas curtain device is usually mounted to the load port module to form a gas curtain for preventing entrance of moisture or foreign matter into the FOUP when a pod door of the FOUP is removed. However, the gas curtain formed by the conventional gas curtain device is not adjustable and the cost associated with a curtain-forming gas is relatively high.

SUMMARY

Therefore, a first object of the disclosure is to provide a load port assembly with a gas curtain device in which a thickness of a gas curtain is adjustable. A second object of the disclosure is to provide a gas curtain device for the load port assembly. A third object of the disclosure is to provide a purging method using the load port assembly.

According to a first aspect of the disclosure, a load port assembly for a substrate storage pod includes a stage, a port plate, and a gas curtain device. The stage is configured for supporting the substrate storage pod thereon. The port plate is disposed vertically relative to the stage, and has a front plate surface and a rear plate surface which are disposed distal from and proximate to the stage, respectively. The port plate defines an access port which extends through the front and rear plate surfaces in a front-to-rear direction. The gas curtain device is mounted on the front plate surface in proximity to the access port, and includes an elongated casing and a gate mechanism. The elongated casing defines therein an inner space, and has an elongated port which is configured to permit a curtain-forming gas introduced into the inner space to be discharged from the elongated port, thereby forming a gas curtain having a thickness in the front-to-rear direction, and a width in a left-to-right direction for shielding the access port. The gate mechanism is mounted to the elongated casing, and is configured to be actuatable so as to vary the thickness of the gas curtain.

According to a second aspect of the disclosure, a gas curtain device for a load port assembly is provided. The load port assembly includes a stage and a port plate. The port plate is disposed vertically relative to the stage, and has a front plate surface and a rear plate surface which are disposed distal from and proximate to the stage, respectively. The port plate defines an access port which extends through the front and rear plate surfaces in a front-to-rear direction. The gas curtain device is mounted on the front plate surface in proximity to the access port, and includes an elongated casing and a gate mechanism. The elongated casing defines therein an inner space, and has an elongated port which is configured to permit a curtain-forming gas introduced into the inner space to be discharged from the elongated port, thereby forming a gas curtain having a thickness in the front-to-rear direction, and a width in a left-to-right direction for shielding the access port. The gate mechanism is mounted to the elongated casing, and is configured to be actuatable so as to vary the thickness of the gas curtain.

According to a third aspect of the disclosure, a purging method for a substrate storage pod is provided. The substrate storage pod is lockable on a load port assembly, and is displaceable between a loading and unloading position, where a pod door for enclosing a pod chamber of the substrate storage pod is remote from a port door of the load port assembly, and a coupling position, where the pod door is coupled to the port door. The purging method includes the steps of:

a) introducing a first purge gas into a pod chamber of the substrate storage pod, and detecting relative humidity of a first discharge gas from the pod chamber when a processing module determines that the substrate storage pod in the loading and unloading position is locked to the load port assembly;

b) repeating step a) until the processing module determines that the substrate storage pod is displaced to the coupling position;

c) forming a gas curtain for shielding an access port when the processing module determines that the pod door is prepared to be opened by being removed together with the port door so as to open the access port and the pod chamber;

d) intruding a second purge gas into the pod chamber, and detecting a relative humidity of a second discharge gas from the pod chamber when the processing module determines that the pod door is opened;

e) repeating steps c) and d) until the processing module determines that the pod door is moved back to enclose the pod chamber again;

f) intruding a third purge gas into the pod chamber, and detecting a relative humidity of a third discharge gas from the pod chamber when the processing module determines that the substrate storage pod is displaced away from the coupling position; and g) repeating step f) until the processing module determines that the substrate storage pod in the loading and unloading position is unlocked from the load port assembly, wherein when the processing module determines that the relative humidity of a corresponding one of the first, second, and third discharge gases is inconsistent with a predetermined relative humidity, the processing module is operated to adjust a flow rate of a corresponding one of the first, second, and third purge gases; and when the processing module determines that the relative humidity of the second discharge gas is inconsistent with the predetermined relative humidity, the processing module is operated to adjust a thickness of the gas curtain.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
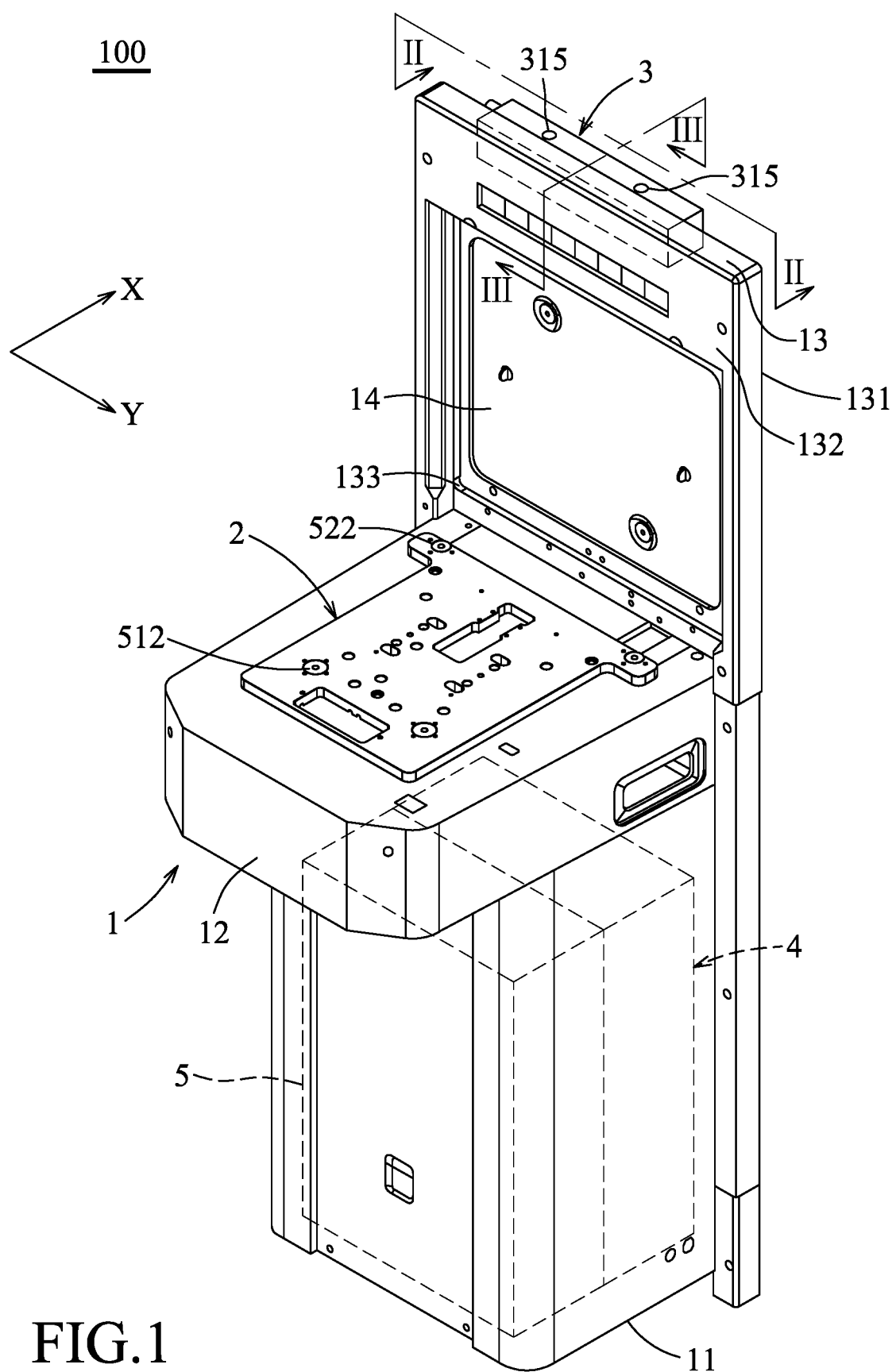
FIG. 1 is a perspective view of a load port assembly according to a first embodiment of the disclosure.

Before the disclosure is described in greater detail, it should be noted that where considered appropriate, reference numerals have been repeated among the figures to indicate corresponding or analogous elements, which may optionally have similar characteristics.

To aid in describing the disclosure, directional terms may be used in the specification and claims to describe portions of the present disclosure (e.g., front, rear, left, right, top, bottom, etc.). These directional definitions are intended to merely assist in describing and claiming the disclosure and are not intended to limit the disclosure in any way.

Figure 8:
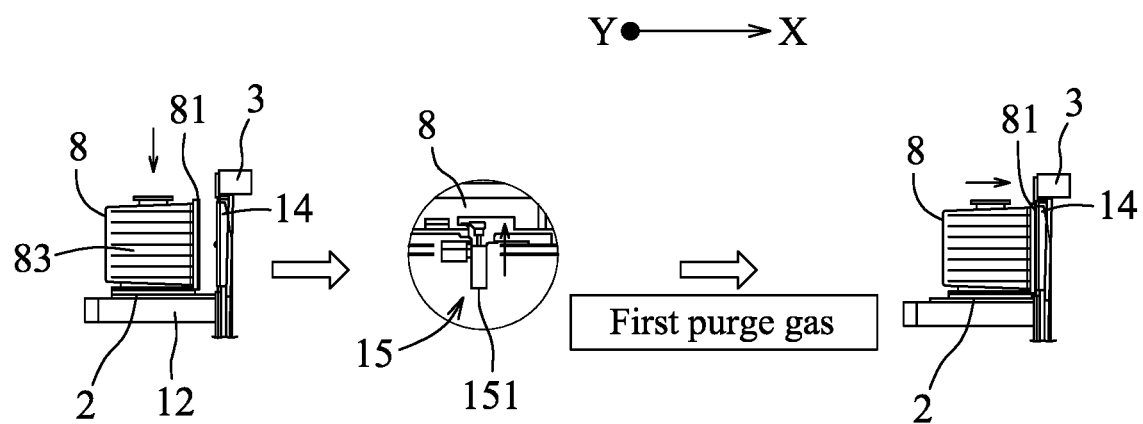
FIG. 8 is a schematic view illustrating a process for purging the substrate storage pod using a first purge gas.
Figure 10:
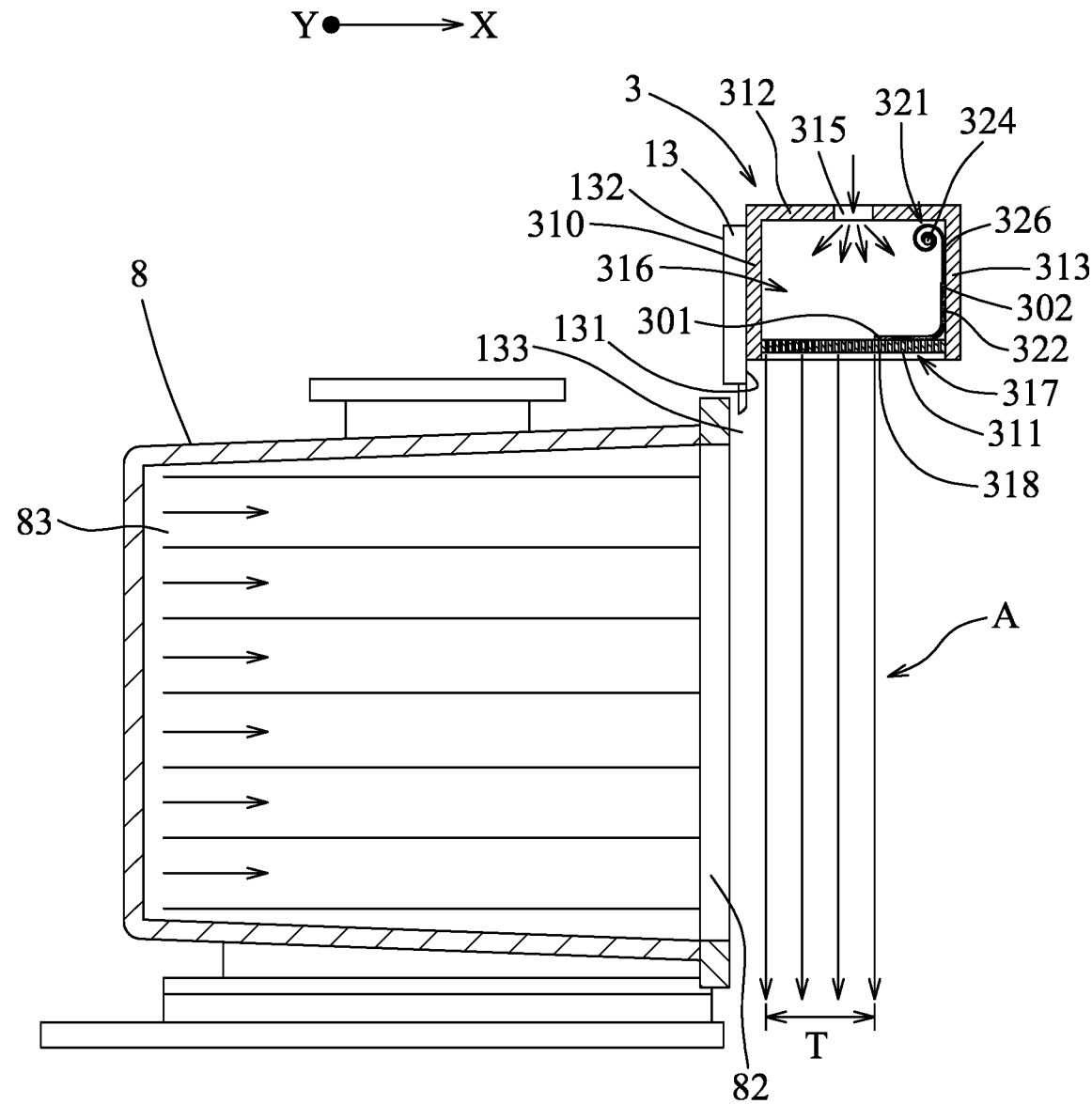
FIG. 10 is a partially cross-sectional view illustrating when a pod chamber is opened.

Referring to FIGS. 1, 8, and 10, a load port assembly 100 for purging a substrate storage pod 8 according to a first embodiment of the disclosure is shown to include a machine frame 1 and a gas curtain device 3. The substrate storage pod 8 has a pod chamber 83 for storing a plurality of wafers (not shown) or photomasks (not shown) therein, a pod opening 82, and a pod door 81 which is removably attached to the pod opening 82 for enclosing the pod chamber 83. In an embodiment, the substrate storage pod 8 may be a front opening unified pod (FOUP) for storing the wafers therein.

The machine frame 1 includes a stage 12 and a port plate 13. The stage 12 is configured for supporting the substrate storage pod 8 thereon. The port plate 13 is disposed vertically relative to the stage 12, and has a front plate surface 131 and a rear plate surface 132 which are disposed distal from and proximate to the stage 12, respectively. The port plate 13 defines an access port 133 which extends through the front and rear plate surfaces 131, 132 in a front-to-rear direction (X).

Figure 9:
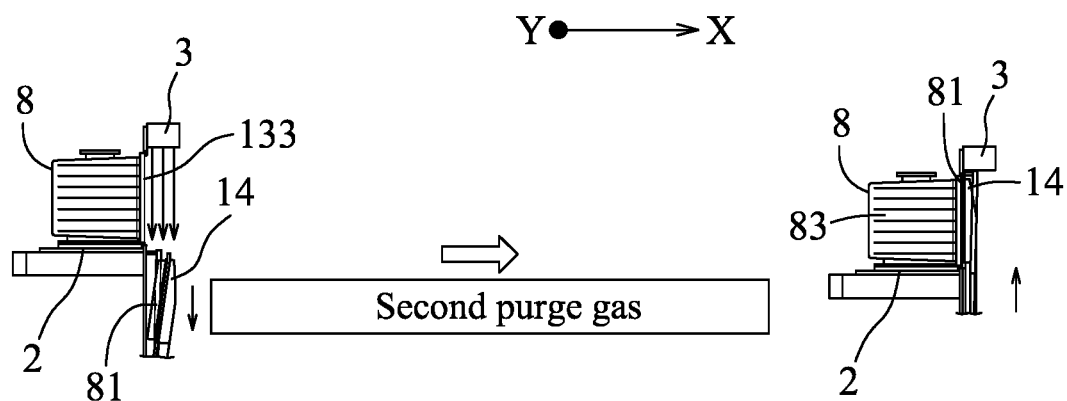
FIG. 9 is a schematic view illustrating a process for purging the substrate storage pod using a second purge gas.

In an embodiment shown in FIGS. 1 and 9, the machine frame 1 further includes a port door 14 and a storage section 11. The storage section 11 is disposed beneath the stage 12. The port door 14 is attached removably to the access port 133 of the port plate 13, and is disposed for being in register with the pod door 81. The port door 14 is configured to be coupled to hold the pod door 81 so as to permit the pod door 81 to be removed together with the port door 14 from the substrate storage pod 8. When the pod door 81 is removed, a semiconductor manufacturing device (not shown) can access the wafers (not shown) inside the pod chamber 83 of the substrate storage pod 8.

In an embodiment shown in FIGS. 1 and 8, the load port assembly 100 further includes a moving base 2 which is movably mounted on the stage 12, and which is configured to permit the substrate storage pod 8 to be locked thereon to move with the moving base 2.

The gas curtain device 3 is mounted on the front plate surface 131 in proximity to the access port 133, and includes an elongated casing 31 and agate mechanism 32. In an embodiment shown in FIGS. 1 and 10, the gas curtain device 3 may be mounted above the access port 133.

Figure 2:
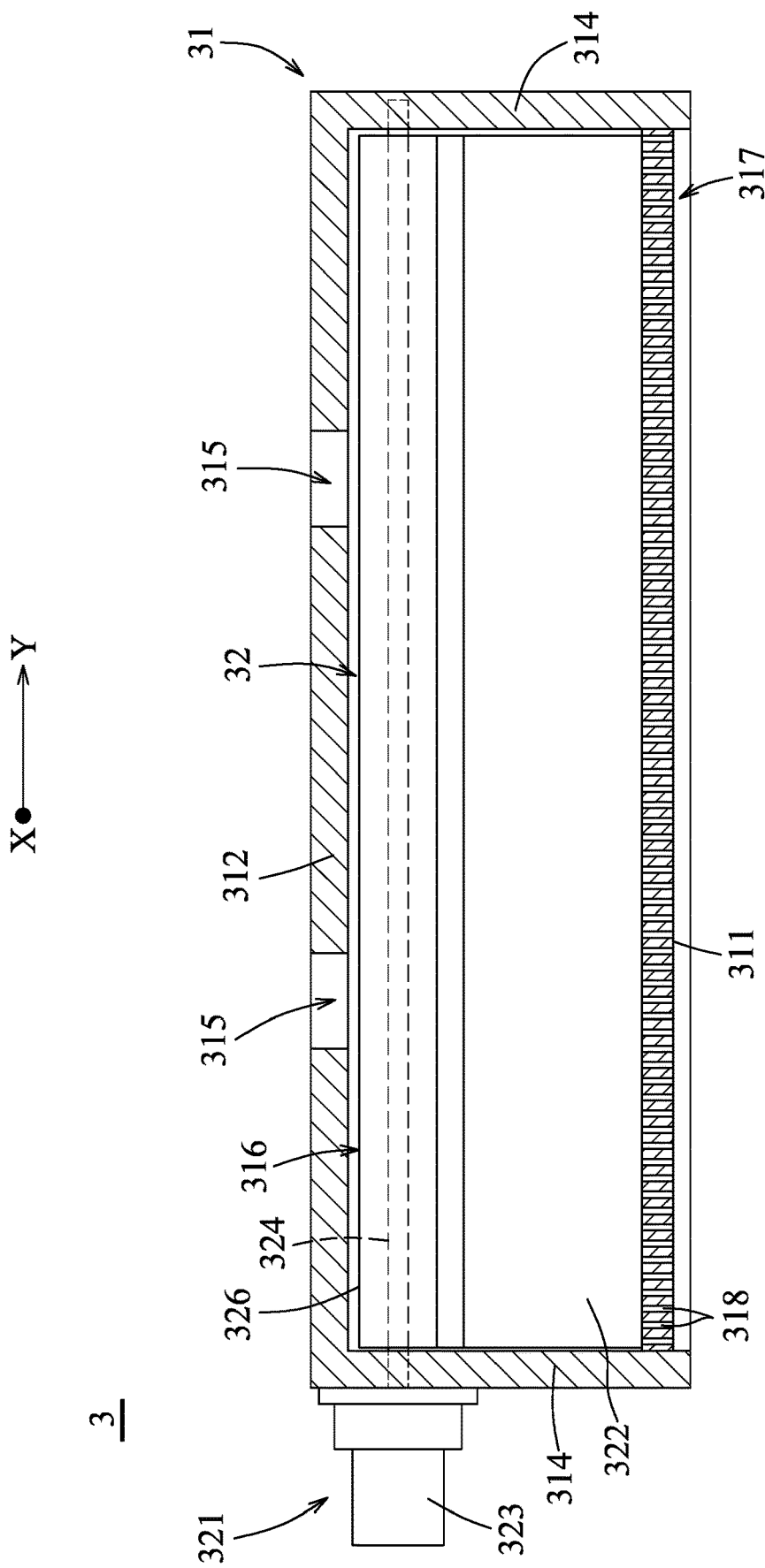
FIG. 2 is a partially cross-sectional view taken along line II-II of FIG. 1.
Figure 3:
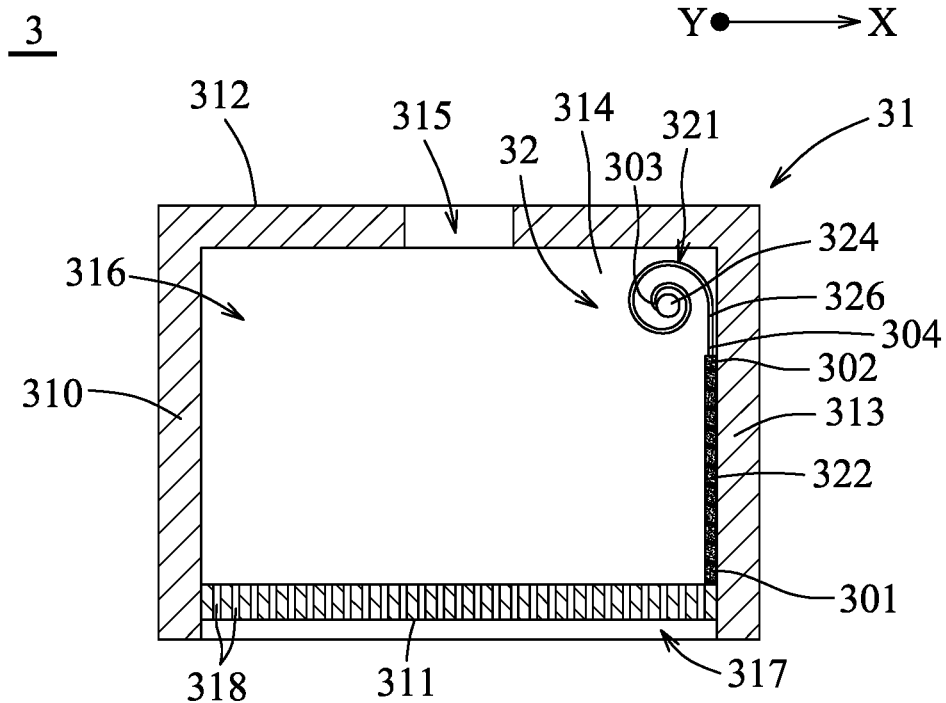
FIG. 3 is a partially cross-sectional view taken along line III-III of FIG. 1.
Figure 4:
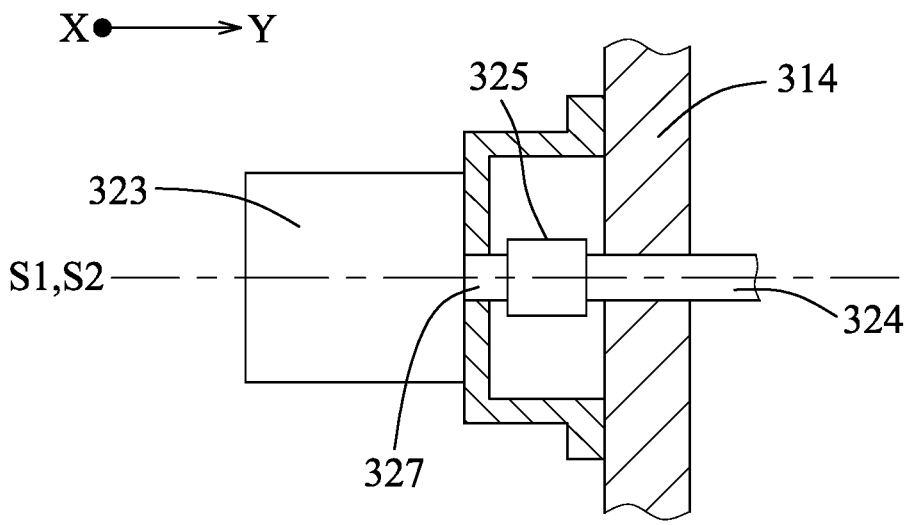
FIG. 4 is a fragmentary, enlarged, partially cross-sectional view illustrating a door actuating unit of a gas curtain device in the load port assembly.

As shown in FIGS. 2, 3, and 10, the elongated casing 31 defines therein an inner space 316, and has an elongated port 317 which is configured to permit a curtain-forming gas introduced into the inner space 316 to be discharged from the elongated port 317, thereby forming a gas curtain (A) having a thickness (T) in the front-to-rear direction (X), and a width in a left-to-right direction (Y) for shielding the access port 133.

In an embodiment shown in FIGS. 2, 3, and 10, the elongated casing 31 may include a top wall 312, a rear elongated wall 310, a front elongated wall 313, and two sidewalls 314. The top wall 312 is formed with a gas inlet 315 upstream of the inner space 316. The rear elongated wall 310 is mounted on the front plate surface 131 of the port plate 13. The front elongated wall 313 is opposite to the rear elongated wall 310 in the front-to-rear direction (X). The two sidewalls 314 are opposite to each other in the left-to-right direction (Y), and define the inner space 316 together with the top wall 312 and the front and rear elongated walls 313, 310. Lower margins of the front and rear elongated walls 313, 310 and the sidewalls 314 together define the elongated port 317. In an embodiment shown in FIGS. 1 to 3, each of the top wall 312, the front and rear elongated walls 313, 310, and the two sidewalls 314 is a rectangle wall, and two of the gas inlets 315 are formed in the top wall 312.

As shown in FIGS. 3 and 10, the gate mechanism 32 is mounted to the elongated casing 31, and is configured to be actuatable so as to vary the thickness (T) of the gas curtain (A).

In an embodiment shown in FIGS. 3 and 10, the gas curtain device 3 further includes an elongated plate 311 which is fitted in the elongated port 317, and which has a plurality of through holes 318 configured to permit the curtain-forming gas to pass therethrough to thereby forming the gas curtain (A). The elongated plate 311 may be secured to the lower margins of the front and rear elongated walls 313, 310 and the sidewalls 314 through suitable adhesive materials or suitable fastening members (such as bolts). Each of the through holes 318 may have a diameter ranging from 0.01 to 2 mm. The elongated plate 311 may be made from a super high molecular weight polyethylene with an average molecular weight ranging from one million to nine million. The curtain-forming gas may be clean dry air (CDA) or nitrogen gas. The gas curtain (A) may be in a laminar flow condition.

Figure 11:
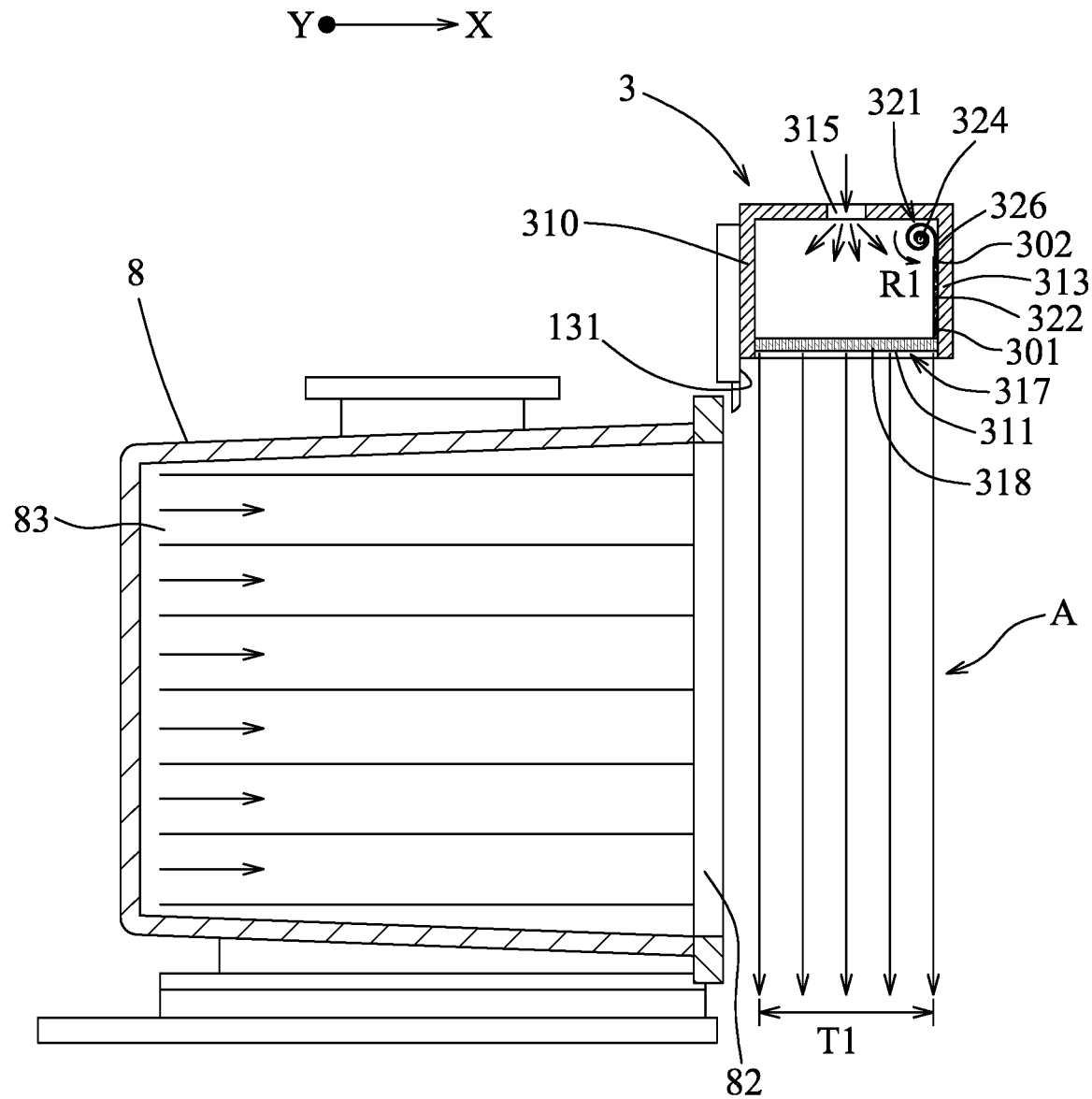
FIG. 11 is similar to FIG. 10 but illustrating a gas curtain with a larger thickness.
Figure 12:
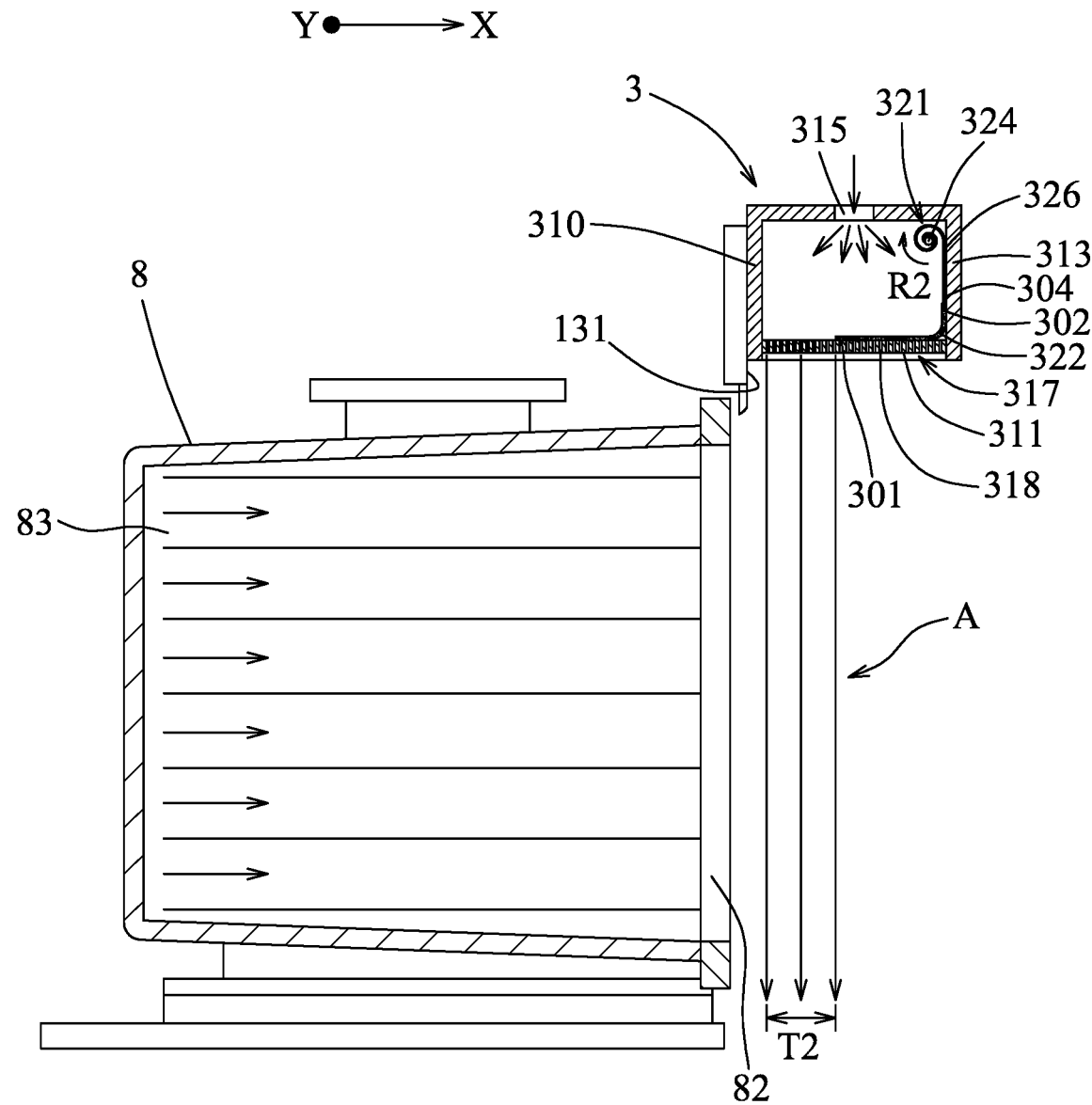
FIG. 12 is similar to FIG. 10 but illustrating the gas curtain with a smaller thickness.

In an embodiment shown in FIGS. 10 to 12, the gate mechanism 32 may include a door actuating unit 321 and a shutter door 322. The shutter door 322 is displaceable between a fully open position and a partially closed position. In the fully open position, as shown in FIG. 11, the through holes 318 are fully open to permit the gas curtain (A) to have a first thickness (T1). In the partially closed position, as shown in FIG. 12, some of the through holes 318 are blocked by the shutter door 322 to permit the gas curtain (A) to have a second thickness (T2) which is smaller than the first thickness (T1). The shutter door 322 is made from a flexible, gas-impermeable material.

In an embodiment shown in FIGS. 10 to 12, the shutter door 322 has a distal end segment 301 and a proximate end segment 302 relative to the door actuating unit 321, and is configured to be flexible such that while the door actuating unit 321 is operated to displace the shutter door 322 to the partially closed position (FIG. 12) from the fully open position (FIG. 11), the proximate end segment 302 is forced to slide downward along the front elongated wall 313 to let the distal end segment 301 slide on the elongated plate 311 to thereby block some of the through holes 318.

The door actuating unit 321 is coupled to drive displacement of the shutter door 322.

In an embodiment shown in FIGS. 2 to 4 and 10 to 12, the door actuating unit 321 includes a motor 323, an elongated shaft 324, and an actuator sheet 326.

The motor 323 is mounted on the elongated casing 31, and has an output shaft 327 which extends along a first shaft axis (S1). In an embodiment shown in FIG. 4, the motor 323 is mounted to one of the sidewalls 314 through, for example, screws, and the first shaft axis (S1) is in the left-to-right direction (Y).

The elongated shaft 324 is mounted between the sidewalls 314 in proximity to the front elongated wall 313, and is coupled to be driven by the output shaft 327 to rotate about a second shaft axis (S2) which is in the left-to-right direction (Y). In an embodiment shown in FIG. 4, the elongated shaft 324 is coupled to the output shaft 327 through a coupling member 325 so as to coaxially rotate with the output shaft 327.

The actuator sheet 326 is made from a flexible material and has a length slightly smaller than a length of the elongated plate 311. The actuator sheet 326 is windable on the elongated shaft 324, and has a first connection marginal end 303 connected to the elongated shaft 324, and a second connection marginal end 304 connected to the proximate end segment 302 of the shutter door 322, such that when the elongated shaft 324 is driven to rotate, the actuator sheet 326 is permitted to unwind from the elongated shaft 324 to thereby force the proximate end segment 302 to slide downward along the front elongated wall 313.

Figure 5:
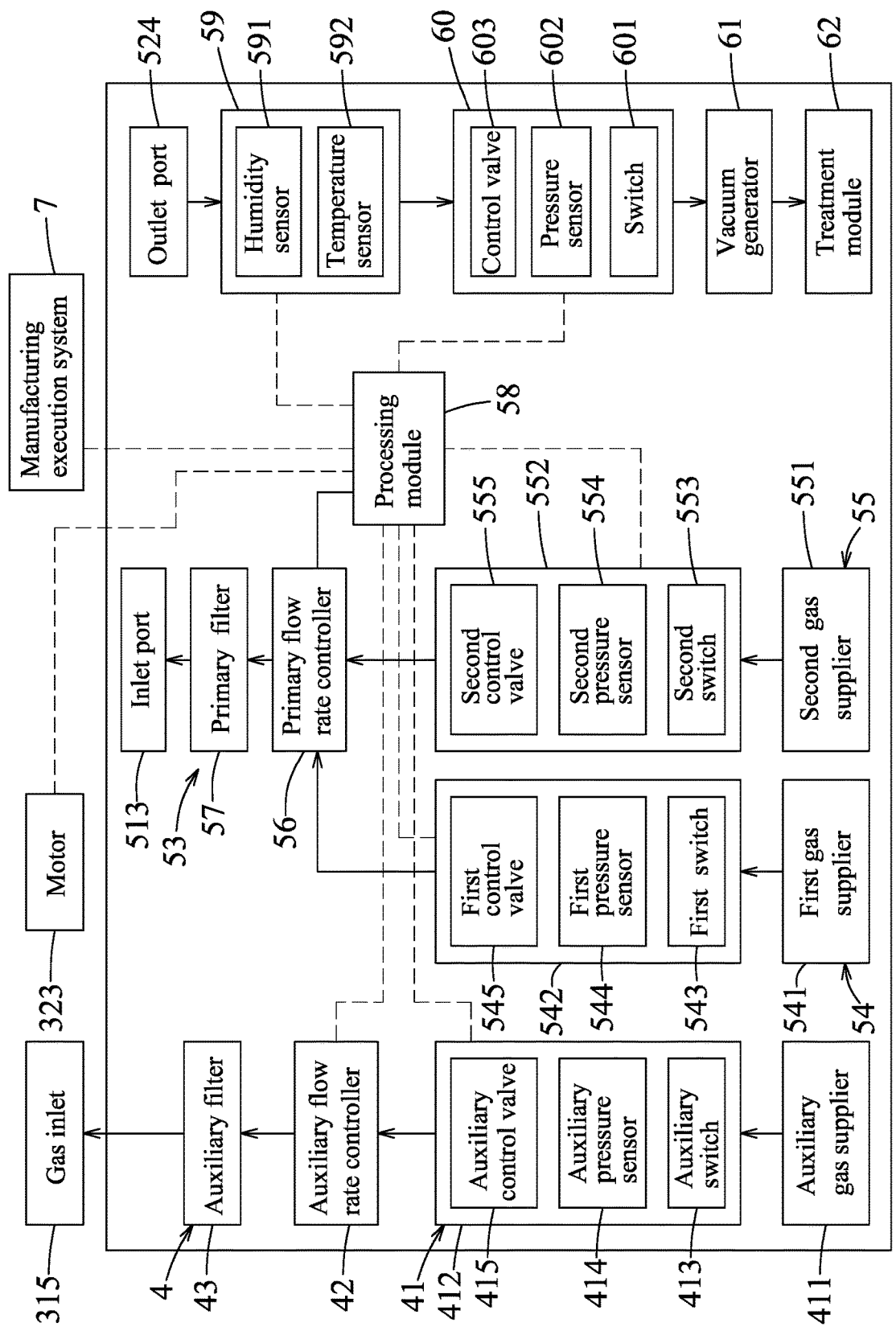
FIG. 5 is a schematic block diagram of the load port assembly according to the first embodiment of the disclosure.
Figure 6:
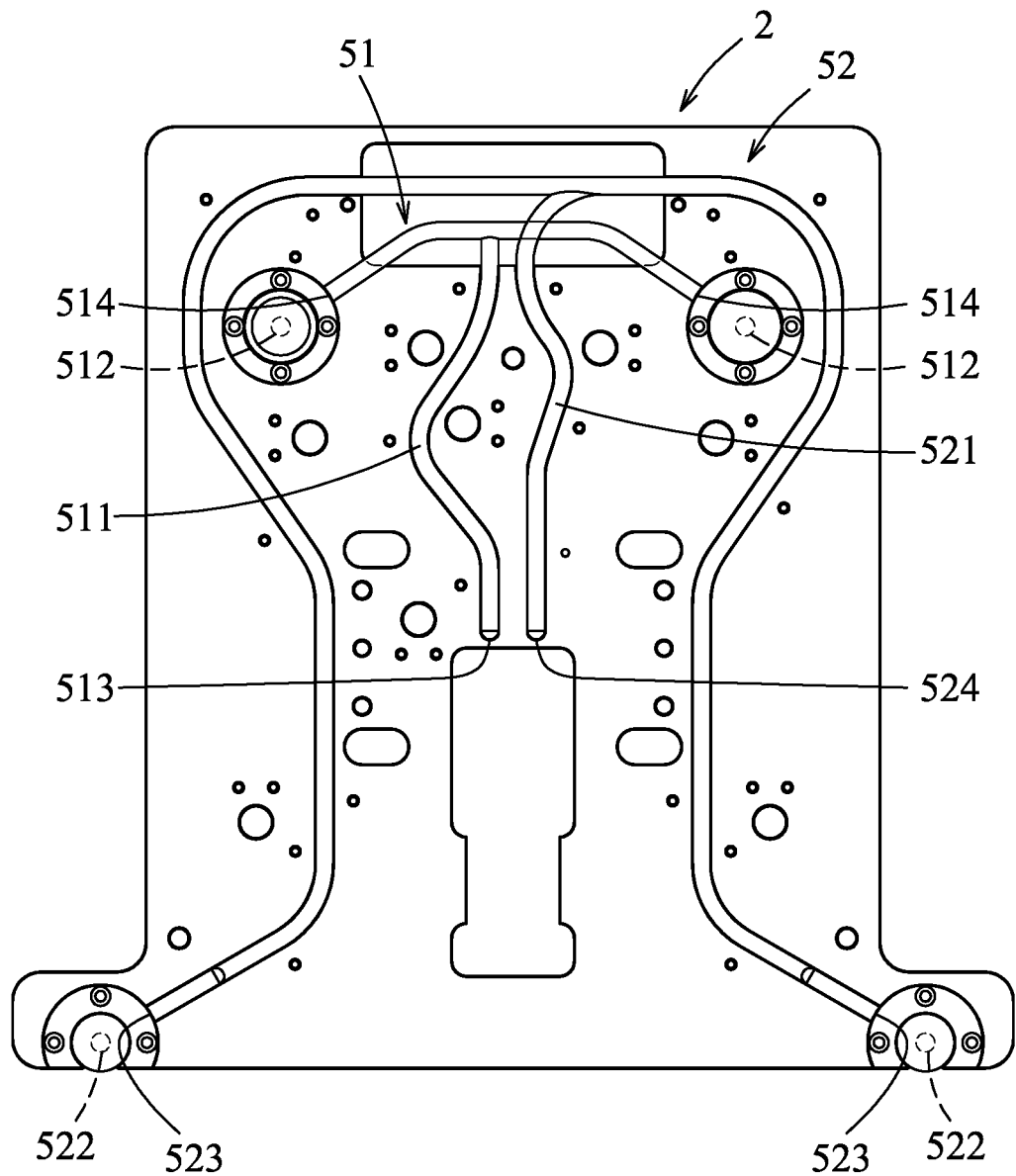
FIG. 6 is a bottom view of a moving base of the load port assembly.

In an embodiment shown in FIGS. 1, 5, and 6, the load port assembly 100 may further include an injection nozzle unit 51, a discharge nozzle unit 52, and a system 5.

The injection nozzle unit 51 is mounted to permit a purge gas to be injected into the pod chamber 83 inside the substrate storage pod 8.

In an embodiment shown in FIG. 6, the injection nozzle unit 51 includes a gas introducing tube 511 and two injection nozzles 512 disposed downstream of the gas introducing tube 511. The gas introducing tube 511 is mounted on a lower surface of the moving base 2, and has an inlet port 513 distal from the injection nozzles 512 and two outlet ports 514 proximate to a respective one of the injection nozzles 512. Each of the injection nozzles 512 is mounted in an upper surface of the moving base 2 for coupling with an inlet valve (not shown) of the substrate storage pod 8 so as to permit the purge gas to be injected into the pod chamber 83.

The discharge nozzle unit 52 is mounted to permit discharge of the gas inside the pod chamber 83.

In an embodiment shown in FIG. 6, the discharge nozzle unit 52 includes a gas discharge tube 521 and two discharge nozzles 522 disposed upstream of the gas discharge tube 521. The gas discharge tube 521 is mounted on the lower surface of the moving base 2, and has two inlet ports 523 proximate to a respective one of the discharge nozzles 522 and an outlet port 524 distal from the discharge nozzles 522. Each of the discharge nozzles 522 is mounted in the upper surface of the moving base 2 for coupling with an outlet valve (not shown) of the substrate storage pod 8 so as to permit discharge of the gas inside the pod chamber 83.

The system 5 is disposed inside the storage section 11 and includes a sensor module 59 and a processing module 58.

The sensor module 59 is disposed downstream of the outlet port 524 of the discharge nozzle unit 52 for detecting relative humidity of the discharge gas from the pod chamber 83. In an embodiment shown in FIG. 5, the sensor module 59 may include a humidity sensor 591 for detecting the relative humidity of the discharge gas, and a temperature sensor 592 for detecting a temperature of the discharge gas.

The processing module 58 electrically communicates with the sensor module 59 and the gate mechanism 32 such that, when the processing module 58 determines that the relative humidity of the discharge gas is inconsistent with a predetermined relative humidity, the processing module 58 is operated to actuate the gate mechanism 32 to thereby vary the thickness (T) of the gas curtain (A).

In an embodiment shown in FIGS. 3 and 5, the system 5 may further include a primary gas supplying mechanism 53 and the load port assembly 100 may further include an auxiliary gas supplying mechanism 4 disposed inside the storage section 11.

The primary gas supplying mechanism 53 is disposed upstream of the inlet port 513 of the injection nozzle unit 51, and is configured for supplying the purge gas to the pod chamber 83. The primary gas supplying mechanism 53 includes a first gas supplying unit 54 and a primary flow rate controller 56.

The first gas supplying unit 54 includes a first gas supplier 541 for supplying a first gas to the injection nozzle unit 51 to serve as the purge gas. In an embodiment, the first gas is clean dry air (CDA).

The primary flow rate controller 56 is disposed downstream of the first gas supplier 541 to control a flow rate of the purge gas.

The auxiliary gas supplying mechanism 4 is connected upstream of the inner space 316 of the elongated casing 31, and includes an auxiliary gas supplying unit 41 and an auxiliary flow rate controller 42.

The auxiliary gas supplying unit 41 includes an auxiliary gas supplier 411 for supplying the curtain-forming gas to the inner space 316 of the elongated casing 31.

The auxiliary flow rate controller 42 is disposed downstream of the auxiliary gas supplier 411 to control a flow rate of the curtain-forming gas.

In addition, the processing module 58 electrically communicates with the primary and auxiliary gas supplying mechanisms 53, 4. When the processing module determines that the relative humidity of the discharge gas is lower than the predetermined relative humidity, the processing module 58 is operated to (i) actuate the gate mechanism 32 to reduce the thickness (T) of the gas curtain (A), (ii) cause the primary flow rate controller 56 to reduce the flow rate of the purge gas, and (iii) cause the auxiliary flow rate controller 42 to reduce the flow rate of the curtain-forming gas. When the processing module 58 determines that the relative humidity of the discharge gas is higher than the predetermined relative humidity, the processing module 58 is operated to (i) actuate the gate mechanism 32 to increase the thickness (T) of the gas curtain (A), (ii) cause the primary flow rate controller 56 to increase the flow rate of the purge gas, and (iii) cause the auxiliary flow rate controller 42 to increase the flow rate of the curtain-forming gas.

In an embodiment shown in FIG. 5, the first gas supplying unit 54 may further include a first pressure adjusting member 542 which is disposed between the first gas supplier 541 and the primary flow rate controller 56, and which has a first switch 543, a first pressure sensor 544, and a first control valve 545. The processing module 58 electrically communicates with the first pressure adjusting member 542. When the processing module 58 determines, from the data collected by the first pressure sensor 544, that the pressure of the first gas is inconsistent with a first predetermined pressure value of the first gas, the processing module 58 is operated to cause the first control valve 545 to adjust the pressure of the first gas so as to set the pressure of the first gas in the first predetermined pressure value. The processing module 58 may be operated to permit or forbid the supply of the first gas via the first switch 543.

In addition, the auxiliary gas supplying unit 41 may further include an auxiliary pressure adjusting member 412 which is disposed between the auxiliary gas supplier 411 and the auxiliary flow rate controller 42, and which includes an auxiliary switch 413, an auxiliary pressure sensor 414, and an auxiliary control valve 415. The processing module 58 electrically communicates with the auxiliary pressure adjusting member 412. When the processing module 58 determines, from the data collected by the auxiliary pressure sensor 414, that the pressure of the curtain-forming gas is inconsistent with a third predetermined pressure value of the curtain-forming gas, the processing module 58 is operated to cause the auxiliary control valve 415 to adjust the pressure of the curtain-forming gas so as to set the pressure of the curtain-forming gas in the third predetermined pressure value. The processing module 58 may be operated, via the auxiliary switch 413, to permit or forbid the supply of the curtain-forming gas.

In an embodiment shown in FIG. 5, the primary gas supplying mechanism 53 may further include a primary filter 57 disposed between the inlet port 513 and the primary flow rate controller 56 for filtration and cleaning of the purge gas. Furthermore, the auxiliary gas supplying mechanism 4 may further include an auxiliary filter 43 disposed between the gas inlet 315 and the auxiliary flow rate controller 42 for filtration and cleaning of the curtain-forming gas.

In an embodiment shown in FIG. 5, the primary gas supplying mechanism 53 may further include a second gas supplying unit 55 which is connected upstream of the primary flow rate controller 56, and which includes a second gas supplier 551 configured for supplying a second gas. The processing module 58 is further operated to permit one of the first and second gases to be supplied to the primary flow rate controller 56 to serve as the purge gas. The second gas is different from the first gas. In an embodiment, the second gas is a nitrogen gas.

In an embodiment shown in FIG. 5, the second gas supplying unit 55 further includes a second pressure adjusting member 552 which is disposed between the second gas supplier 551 and the primary flow rate controller 56, and which has a second switch 553, a second pressure sensor 554, and a second control valve 555. The processing module 58 electrically communicates with the second pressure adjusting member 552. When the processing module 58 determines, from the data collected by the second pressure sensor 554, that the pressure of the second gas is inconsistent with a second predetermined pressure value of the second gas, the processing module 58 is operated to cause the second control valve 555 to adjust the pressure of the second gas so as to set the pressure of the second gas to the second predetermined pressure value. The processing module 58 may be operated to permit or forbid the supply of the second gas via the second switch 553. In this embodiment, the processing module 58 may be operated to turn on only one of the first and second switches 543, 553 at one time.

In an embodiment shown in FIG. 5, the system 5 may further include a pressure modulator 60, a vacuum generator 61, and a treatment module 62.

The pressure modulator 60 is disposed downstream of the sensor module 59 for adjusting the pressure of the discharge gas, and includes a switch 601, a pressure sensor 602, and a control valve 603. The processing module 58 electrically communicates with the pressure modulator 60. When the processing module 58 determines, from the data collected by the pressure sensor 602, that the pressure of the discharge gas is inconsistent with a fourth predetermined pressure value of the discharge gas, the processing module 58 is operated to cause the control valve 603 to adjust the pressure of the discharge gas so as to set the pressure of the discharge gas to the fourth predetermined pressure value. The processing module 58 may be operated to permit or forbid generation of a vacuum in the pod chamber 83 via the switch 601.

The vacuum generator 61 is disposed downstream of the pressure modulator 60 for generating a vacuum air flow so as to generate a vacuum in the pod chamber 83.

The treatment module 62 is disposed downstream of the vacuum generator 61 for removal of contaminants entrained in the discharge gas.

In an embodiment shown in FIG. 5, the processing module 58 electrically communicates with a manufacturing execution system (MES) 7 for executing a purging method according to the first embodiment of the disclosure.

Figure 7:
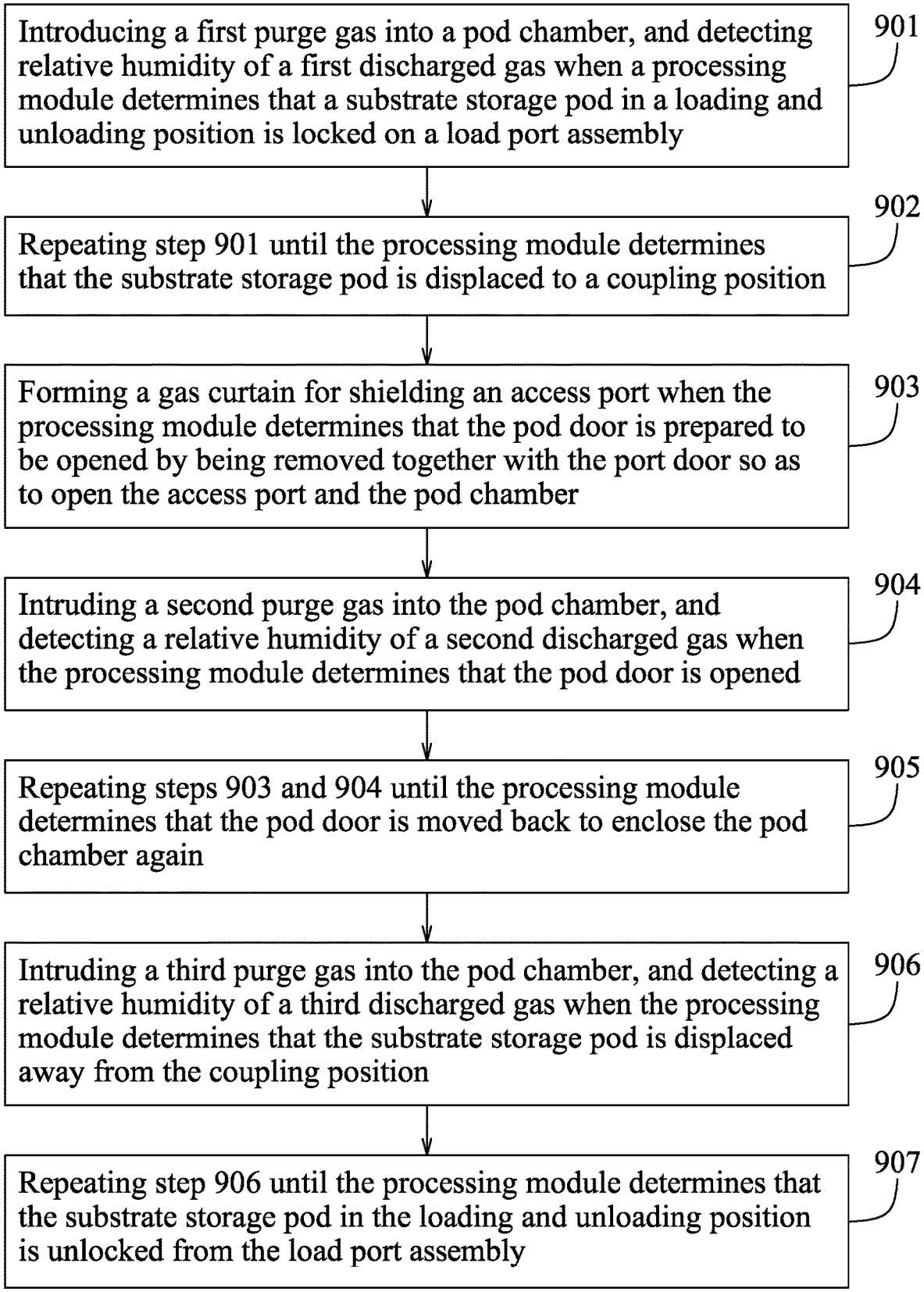
FIG. 7 is a flow diagram illustrating a purging method for a substrate storage pod according to an embodiment of the disclosure.

The purging method is used for purging the substrate storage pod 8. The substrate storage pod 8 is lockable on the moving base 2 of the load port assembly 100, and is displaceable between a loading and unloading position and a coupling position. In the loading and unloading position, as shown in the left part of FIG. 8, the pod door 81 is remote from the port door 14 of the load port assembly 100. In the coupling position, as shown in the right part of FIG. 8, the pod door 81 is coupled to the port door 14. As shown in FIG. 7, the purging method includes steps 901 to 907.

Based on the previous process and the present process for treating the wafers (not shown) inside the substrate storage pod 8, the manufacturing execution system (MES) 7 is operated to cause the processing module 58 to permit the first gas or the second gas to serve as the purge gas.

In step 901, a first purge gas is introduced into the pod chamber 83 of the substrate storage pod 8, and a relative humidity of a first discharge gas from the pod chamber 83 is detected when a processing module 58 determines that the substrate storage pod 8 in the loading and unloading position is locked to the moving base 2 of the load port assembly 100. As shown in FIG. 8, the substrate storage pod 8 is locked to the moving base 2 through a plurality of latch members 151 (only one is shown) of a latch unit 15.

In step 902, step 901 is repeated until the processing module 58 determines that the substrate storage pod 8 is displaced to the coupling position, as shown in the right part of FIG. 8.

In the time period during which steps 901, 902 are performed, a flow rate of the first purge gas is initially set to a relatively large value so as to remove moisture inside the pod chamber 83 and airborne molecular contamination (AMC) on the wafers (not shown).

In step 903, the gas curtain (A) is formed for shielding the access port 133 when the processing module 58 determines that the pod door 81 is prepared to be opened by being removed together with the port door 14 so as to open the access port 133 and the pod chamber 83 (see the left side of FIG. 9). Step 903 may be performed at a predetermined time (for example, 3 seconds) before the pod door 81 is opened.

In step 904, a second purge gas is introduced into the pod chamber 83, and a relative humidity of a second discharge gas from the pod chamber 83 is detected when the processing module 58 determines that the pod door 81 is opened (see the left side of FIG. 9).

In step 905, steps 903 and 904 are repeated until the processing module 58 determines that the pod door 81 is moved back to enclose the pod chamber 83 again (see the right side of FIG. 9). In step 905, the semiconductor manufacturing device (not shown) is permitted to access the wafers (not shown) inside the pod chamber 83 for treatment of the wafers. Step 903 may be further repeated for a predetermined time (for example, 3 seconds) after the pod door 81 is closed.

Figure 13:
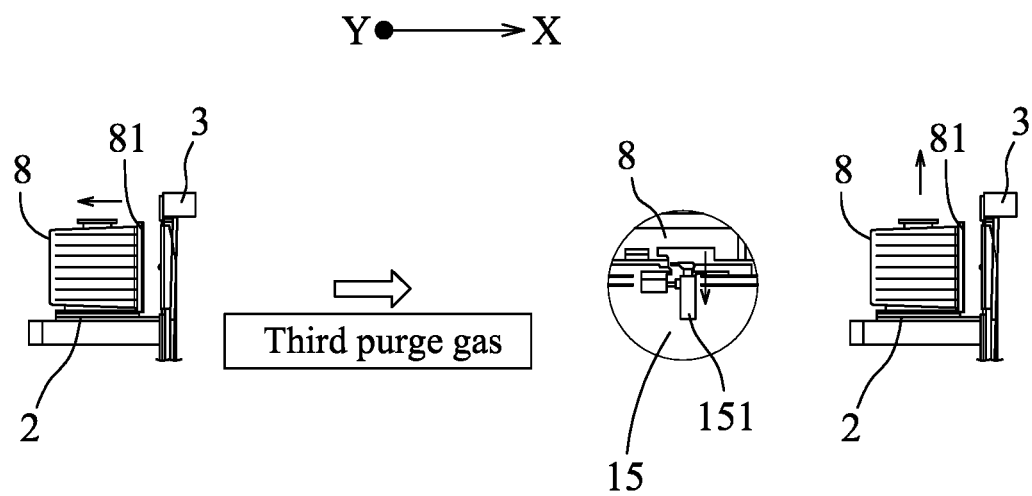
FIG. 13 is a schematic view illustrating a process for purging the substrate storage pod using a third purge gas.

In step 906, a third purge gas is introduced into the pod chamber 83, and a relative humidity of a third discharge gas from the pod chamber 83 is detected when the processing module 58 determines that the substrate storage pod 8 is displaced away from the coupling position (see FIG. 13). In an embodiment, step 906 is performed when the processing module 58 determines that the substrate storage pod 8 is displaced to the loading and unloading position (see the left side of FIG. 13).

In step 907, step 906 is repeated until the processing module 58 determines that the substrate storage pod 8 in the loading and unloading position is unlocked from the load port assembly 100 (see the right side of FIG. 13).

In steps 906 and 907, because the relative humidity inside the pod chamber 83 is relatively low after step 906, the flow rate of the third purge gas may be set at a relatively low value.

The first, second, and third purge gases are independently selected from two different gases, i.e., the first gas (CDA) and the second gas (nitrogen gas).

In an embodiment shown in FIG. 5, in each of steps 901 to 902 and 904 to 907, the processing module 58 may be operated to turn on the first switch 543 and to turn off the second switch 543 so as to permit the first gas (CDA) to serve as the a corresponding one of the first, second, and third purge gases.

It should be noted that if the treatment for the wafer in step 905 is sensitive to oxygen, the processing module 58 may be operated to turn on the second switch 543 and to turn off the first switch 543 in each of steps 904 to 907 so as to permit the second gas (nitrogen gas) to serve as a corresponding one of the second and third purge gases. As such, in each of steps 904 to 907, the oxygen contents inside the pod chamber 83 can be greatly reduced.

When the processing module 58 determines that the relative humidity of a corresponding one of the first, second, and third discharge gases is inconsistent with a predetermined relative humidity, the processing module 58 is operated to adjust a flow rate of a corresponding one of the first, second, and third purge gases. Specifically, when the processing module 58 determines that the relative humidity of the corresponding one of the first, second, and third discharge gases is lower than the predetermined relative humidity, the processing module 58 is operated to reduce the flow rate of the corresponding one of the first, second, and third purge gases. When the processing module 58 determines that the relative humidity of the corresponding one of the first, second, and third discharge gases is higher than the predetermined relative humidity, the processing module 58 is operated to increase the flow rate of the corresponding one of the first, second, and third purge gases.

When the processing module 58 determines that the relative humidity of the second discharge gas is inconsistent with the predetermined relative humidity, the processing module 58 is operated to adjust a thickness (T) of the gas curtain (A). Specifically, when the processing module 58 determines that the relative humidity of the second discharge gas is lower than the predetermined relative humidity, the processing module 58 is operated to reduce the thickness (T) of the gas curtain (A). For example, the thickness (T) of the gas curtain (A) shown in FIG. 10 may be reduced to the second thickness (T2) shown in FIG. 12. When the processing module 58 determines that the relative humidity of the second discharge gas is higher than the predetermined relative humidity, the processing module 58 is operated to increase the thickness of the gas curtain (A). For example, the thickness (T) of the gas curtain (A) shown in FIG. 10 may be increased to have the first thickness (T1) shown in FIG. 11.

Figure 14:
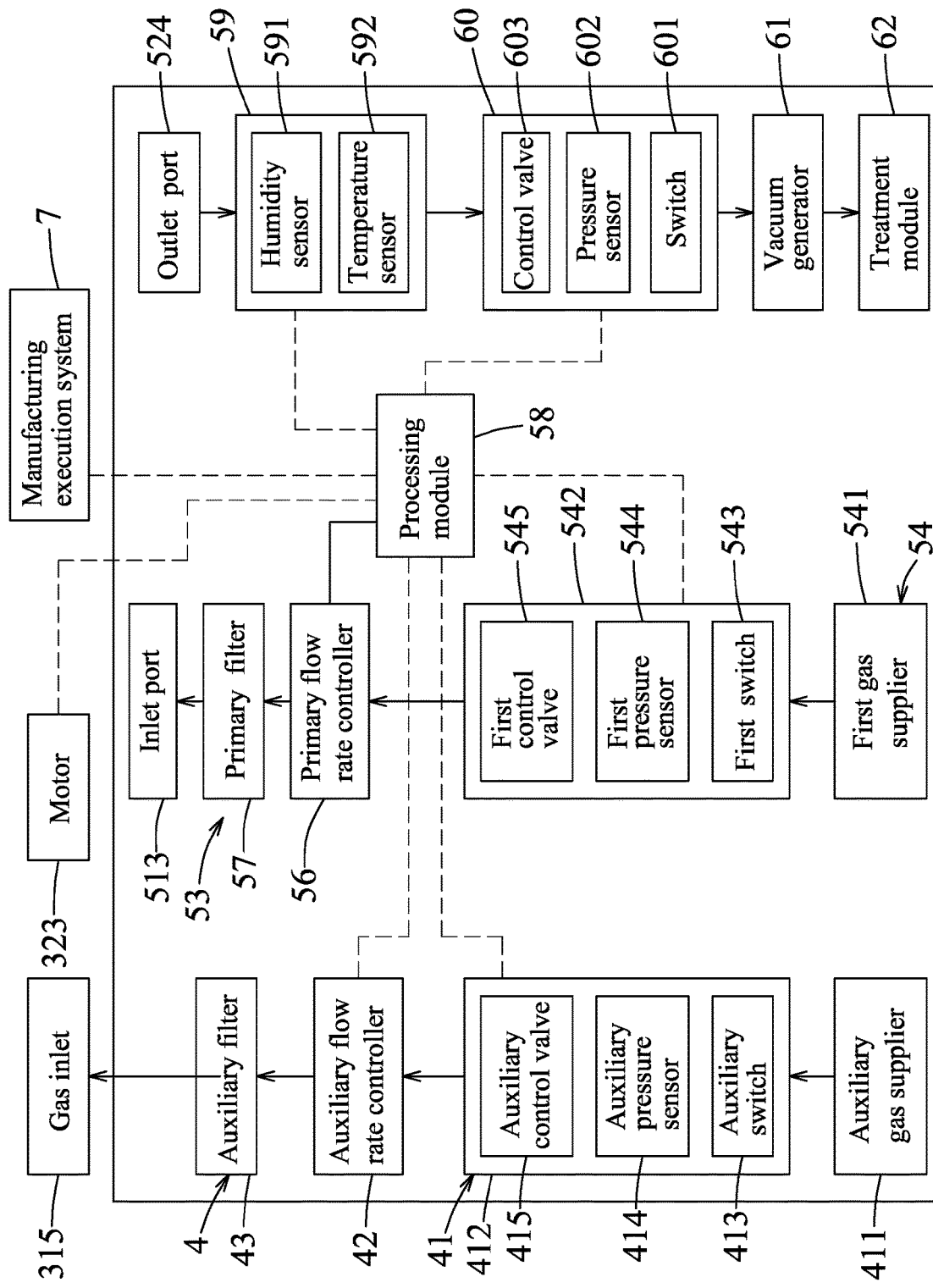
FIG. 14 is a schematic block diagram of a load port assembly according to a second embodiment of the disclosure.

FIG. 14 illustrates a schematic block diagram of a load port assembly according to a second embodiment of the disclosure. The second embodiment is similar to the first embodiment except that in the second embodiment, the primary gas supplying mechanism 53 does not include the second gas supplying unit 55. Therefore, in the second embodiment, each of the first, second, third purge gases is the first gas supplied from the first gas supplier 541.

In sum, because the flow rate of each of the first, second, third purge gases can be adjusted based on the relative humidity of the corresponding one of the first, second, and third discharge gases, the cost associated with the purge gases may be reduced. Similarly, because the flow rate of the curtain-forming gas can be adjusted based on the relative humidity of the second discharge gas, the cost associated with the curtain-forming gas may be reduced.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A load port assembly for a substrate storage pod, comprising:
a stage configured for supporting the substrate storage pod thereon;
a port plate disposed vertically relative to said stage, and having a front plate surface and a rear plate surface which are disposed distal from and proximate to said stage, respectively, said port plate defining an access port which extends through said front and rear plate surfaces in a front-to-rear direction; and
a gas curtain device mounted on said front plate surface in proximity to said access port, and including
an elongated casing defining therein an inner space, and having an elongated port which is configured to permit a curtain-forming gas introduced into said inner space to be discharged from said elongated port, thereby forming a gas curtain having a thickness in the front-to-rear direction, and a width in a left-to-right direction for shielding said access port, and
a gate mechanism mounted to said elongated casing, and configured to be actuatable so as to vary the thickness of the gas curtain.

2. The load port assembly according to claim 1, further comprising a port door which is attached removably to said access port of said port plate, and which is configured to be coupled to hold a pod door of the substrate storage pod.

3. The load port assembly according to claim 1, wherein said gas curtain device further includes an elongated plate which is fitted in said elongated port, and which has a plurality of through holes configured to permit the curtain-forming gas to pass therethrough to thereby forming the gas curtain,
said gate mechanism includes
a shutter door which is displaceable between a fully open position, where said through holes are fully open to permit the gas curtain to have a first thickness, and a partially closed position, where some of said through holes are blocked by said shutter door to permit the gas curtain to have a second thickness which is smaller than the first thickness, and
a door actuating unit coupled to drive displacement of said shutter door.

4. The load port assembly according to claim 3, wherein said elongated casing includes
a top wall formed with a gas inlet upstream of said inner space,
a rear elongated wall mounted on said front plate surface of said port plate,
a front elongated wall opposite to said rear elongated wall in the front-to-rear direction, and
two sidewalls which are opposite to each other in the left-to-right direction, and which define said inner space together with said top wall and said front and rear elongated walls, lower margins of said front and rear elongated walls and said sidewalls together defining said elongated port.

5. The load port assembly according to claim 4, wherein said shutter door has a distal end segment and a proximate end segment relative to said door actuating unit, and is configured to be flexible such that while said door actuating unit is operated to displace said shutter door to the partially closed position from the fully open position, said proximate end segment is forced to slide downward along said front elongated wall to let said distal end segment slide on said elongated plate to thereby block said some of said through holes.

6. The load port assembly according to claim 5, wherein said door actuating unit includes
a motor mounted on said elongated casing, and having an output shaft which extends along a first shaft axis,
an elongated shaft which is mounted between said sidewalls in proximity to said front elongated wall, and which is coupled to be driven by said output shaft to rotate about a second shaft axis which is in the left-to-right direction, and
an actuator sheet which is windable on said elongated shaft, and which has a first connection marginal end connected to said elongated shaft, and a second connection marginal end connected to said proximate end segment of said shutter door, such that when said elongated shaft is driven to rotate, said actuator sheet is permitted to unwind from said elongated shaft to thereby force said proximate end segment to slide downward along said front elongated wall.

7. The load port assembly according to claim 1, further comprising:
a storage section disposed beneath said stage;
an injection nozzle unit mounted to permit a purge gas to be injected into a pod chamber inside the substrate storage pod;
a discharge nozzle unit mounted to permit discharge of a gas inside the pod chamber;
a sensor module disposed inside said storage section downstream of said discharge nozzle unit for detecting relative humidity of the discharge gas from the pod chamber; and
a processing module which is disposed inside storage section, and which electrically communicates with said sensor module and said gate mechanism, such that when said processing module determines that the relative humidity of the discharge gas is inconsistent with a predetermined relative humidity, said processing module is operated to actuate said gate mechanism to thereby vary the thickness of the gas curtain.

8. The load port assembly according to claim 7, further comprising:
a primary gas supplying mechanism disposed inside said storage section upstream of said injection nozzle unit, and configured for supplying the purge gas to the pod chamber, said primary gas supplying mechanism including
a first gas supplying unit including a first gas supplier for supplying a first gas to said injection nozzle unit to serve as the purge gas, and
a primary flow rate controller disposed downstream of said first gas supplier to control a flow rate of the purge gas; and
an auxiliary gas supplying mechanism disposed inside said storage section, and connected upstream of said inner space of said elongated casing, said auxiliary gas supplying mechanism including
an auxiliary gas supplier for supplying the curtain-forming gas to said inner space of said elongated casing, and an auxiliary flow rate controller disposed downstream of said auxiliary gas supplier to control a flow rate of the curtain-forming gas, wherein said processing module electrically communicates with said primary and auxiliary gas supplying mechanisms such that when said processing module determines that the relative humidity of the discharge gas is lower than the predetermined relative humidity, said processing module is operated to (i) actuate said gate mechanism to reduce the thickness of the gas curtain, (ii) cause said primary flow rate controller to reduce the flow rate of the purge gas, and (iii) cause said auxiliary flow rate controller to reduce the flow rate of the curtain-forming gas.

9. The load port assembly according to claim 8, wherein said processing module is operated to (i) actuate said gate mechanism to increase the thickness of the gas curtain, (ii) cause said primary flow rate controller to increase the flow rate of the purge gas, and (iii) cause said auxiliary flow rate controller to increase the flow rate of the curtain-forming gas when said processing module determines that the relative humidity of the discharge gas is higher than the predetermined relative humidity.

10. The load port assembly according to claim 8, wherein said primary gas supplying mechanism further includes a second gas supplying unit which is connected upstream of said primary flow rate controller, and which includes a second gas supplier configured for supplying a second gas; and said processing module is further operated to permit one of the first and second gases to be supplied to said primary flow rate controller to serve as the purge gas.

11. A gas curtain device for a load port assembly which includes a stage, and a port plate disposed vertically relative to said stage, and having a front plate surface and a rear plate surface which are disposed distal from and proximate to the stage, respectively, the port plate defining an access port which extends through the front and rear plate surfaces in a front-to-rear direction, said gas curtain device being mounted on the front plate surface in proximity to the access port, and comprising:

an elongated casing defining therein an inner space, and having an elongated port which is configured to permit a curtain-forming gas introduced into said inner space to be discharged from said elongated port, thereby forming a gas curtain having a thickness in the front-to-rear direction, and a width in a left-to-right direction for shielding the access port, and a gate mechanism mounted to said elongated casing, and configured to be actuatable so as to vary the thickness of the gas curtain.

12. The gas curtain device according to claim 11, further comprising an elongated plate which is fitted in said elongated port, and which has a plurality of through holes configured to permit the curtain-forming gas to pass therethrough to thereby forming the gas curtain, said gate mechanism including a shutter door which is displaceable between a fully open position, where said through holes are fully open to permit the gas curtain to have a first thickness, and a partially closed position, where some of said through holes are blocked by said shutter door to permit the gas curtain to have a second thickness which is smaller than the first thickness, and a door actuating unit coupled to drive displacement of said shutter door.

13. The gas curtain device according to claim 12, wherein said elongated casing includes a top wall formed with a gas inlet upstream of said inner space, a rear elongated wall mounted on the front plate surface of the port plate, a front elongated wall opposite to said rear elongated wall in the front-to-rear direction, and two sidewalls which are opposite to each other in the left-to-right direction, and which define said inner space together with said top wall and said front and rear elongated walls, lower margins of said front and rear elongated walls and said sidewalls together defining said elongated port.

14. The gas curtain device according to claim 13, wherein said shutter door has a distal end segment and a proximate end segment relative to said door actuating unit, and is configured to be flexible such that while said door actuating unit is operated to displace said shutter door to the partially closed position from the fully open position, said proximate end segment is forced to slide downward along said front elongated wall to let said distal end segment slide on said elongated plate to thereby block some of said through holes.

15. The gas curtain device according to claim 14, wherein said door actuating unit includes a motor mounted on said elongated casing, and having an output shaft which extends along a first shaft axis, an elongated shaft which is mounted between said sidewalls in proximity to said front elongated wall, and which is coupled to be driven by said output shaft to rotate about a second shaft axis in the left-to-right direction, and an actuator sheet which is wound on said elongated shaft, and which has a first connection marginal end connected to said elongated shaft, and a second connection marginal end connected to said proximate end segment of said shutter door, such that when said elongated shaft is driven to rotate, said actuator sheet is permitted to unwind from said elongated shaft to thereby force said proximate end segment to slide downward along said front elongated wall.

16. A purging method for a substrate storage pod which is lockable on a load port assembly, and which is displaceable between a loading and unloading position, where a pod door for enclosing a pod chamber of the substrate storage pod is remote from a port door of the load port assembly, and a coupling position, where the pod door is coupled to the port door, the purging method comprising the steps of:

a) introducing a first purge gas into the pod chamber of the substrate storage pod, and detecting relative humidity of a first discharge gas from the pod chamber when a processing module determines that the substrate storage pod in the loading and unloading position is locked to the load port assembly;

b) repeating step a) until the processing module determines that the substrate storage pod is displaced to the coupling position;

c) forming a gas curtain for shielding an access port when the processing module determines that the pod door is prepared to be opened by being removed together with the port door so as to open the access port and the pod chamber;

d) intruding a second purge gas into the pod chamber, and detecting a relative humidity of a second discharge gas from the pod chamber when the processing module determines that the pod door is opened;

e) repeating steps c) and d) until the processing module determines that the pod door is moved back to enclose the pod chamber again;

f) intruding a third purge gas into the pod chamber, and detecting a relative humidity of a third discharge gas from the pod chamber when the processing module determines that the substrate storage pod is displaced away from the coupling position; and g) repeating step f) until the processing module determines that the substrate storage pod in the loading and unloading position is unlocked from the load port assembly, wherein when the processing module determines that the relative humidity of a corresponding one of the first, second, and third discharge gases is inconsistent with a predetermined relative humidity, the processing module is operated to adjust a flow rate of a corresponding one of the first, second, and third purge gases; and when the processing module determines that the relative humidity of the second discharge gas is inconsistent with the predetermined relative humidity, the processing module is operated to adjust a thickness of the gas curtain.

17. The purging method according to claim 16, wherein when the processing module determines that the relative humidity of the corresponding one of the first, second, and third discharge gases is lower than the predetermined relative humidity, the processing module is operated to reduce the flow rate of the corresponding one of the first, second, and third purge gases; and when the processing module determines that the relative humidity of the second discharge gas is lower than the predetermined relative humidity, the processing module is operated to reduce the thickness of the gas curtain.

18. The purging method according to claim 17, wherein when the processing module determines that the relative humidity of the corresponding one of the first, second, and third discharge gases is higher than the predetermined relative humidity, the processing module is operated to increase the flow rate of the corresponding one of the first, second, and third purge gases; and when the processing module determines that the relative humidity of the second discharge gas is higher than the predetermined relative humidity, the processing module is operated to increase the thickness of the gas curtain.

19. The purging method according to claim 16, wherein in step c), a curtain-forming gas is discharged from an elongated port to form the gas curtain, and the thickness of the gas curtain is adjusted by moving a shutter door to fully open or partially block the elongated port.

20. The purging method according to claim 16, wherein the first, second, and third purge gases is independently selected from two different gases.

* * * * *

UNITED STATES PATENT AND TRADEMARK OFFICE
CERTIFICATE OF CORRECTION

PATENT NO. : 10,998,212 B2  
APPLICATION NO. : 16/458741  
DATED : May 4, 2021  
INVENTOR(S) : Kuan-Ting Lin Page 1 of 1

It is certified that error appears in the above-identified patent and that said Letters Patent is hereby corrected as shown below:

On the Title Page

Item (73), should be added:  
Assignee: Springfield Technologies & Intelligence, Inc., Taipei City, Taiwan Signed and Sealed this  
Tenth Day of May, 2022

Katherine Kelly Vidal  
*Director of the United States Patent and Trademark Office*